(12) United States Patent
Yang et al.

(10) Patent No.: US 12,495,563 B2
(45) Date of Patent: Dec. 9, 2025

(54) MANUFACTURING METHOD OF TRENCH-TYPE POWER DEVICE

(71) Applicant: Hangzhou Silicon-Magic Semiconductor Technology Co., Ltd., Hangzhou (CN)

(72) Inventors: Xiao Yang, Hangzhou (CN); Hui Chen, Hangzhou (CN); Jiakun Wang, Hangzhou (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 432 days.

(21) Appl. No.: 18/091,559

(22) Filed: Dec. 30, 2022

(65) Prior Publication Data

US 2023/0215931 A1 Jul. 6, 2023

(30) Foreign Application Priority Data

Dec. 30, 2021 (CN) .......................... 202111648832.0

(51) Int. Cl.
*H10D 12/01* (2025.01)
*H01L 21/04* (2006.01)
*H10D 30/66* (2025.01)
*H10D 62/832* (2025.01)
*H10D 84/00* (2025.01)

(52) U.S. Cl.
CPC ....... *H10D 12/031* (2025.01); *H01L 21/0465* (2013.01); *H01L 21/0495* (2013.01); *H10D 30/668* (2025.01); *H10D 62/8325* (2025.01); *H10D 84/146* (2025.01)

(58) Field of Classification Search
CPC .............. H01L 21/0495; H10D 30/668; H10D 62/8325; H10D 84/146; H10D 8/60
See application file for complete search history.

(56) References Cited

U.S. PATENT DOCUMENTS

| | | | | |
|---|---|---|---|---|
| 2005/0167742 | A1* | 8/2005 | Challa .................. | H10D 84/143 257/E29.264 |
| 2009/0305475 | A1* | 12/2009 | Hshieh ............... | H10D 30/0297 438/237 |
| 2011/0156679 | A1* | 6/2011 | Girdhar .................. | H10D 84/83 438/237 |

FOREIGN PATENT DOCUMENTS

CN 113594043 A 11/2021

* cited by examiner

*Primary Examiner* — Syed I Gheyas
(74) *Attorney, Agent, or Firm* — Westman, Champlin & Koehler, P.A.

(57) ABSTRACT

Disclosed is a manufacturing method of a trench-type power device. The manufacturing method comprises: forming a drift region; forming a first trench and a second trench in the drift region; forming a gate stack in the first trench; forming a doped region and a well region of P type in the drift region by performing first ion implantation; forming a source region of N type in the well region by performing second ion implantation. The well region in which a dopant concentration gradually decreases with depth is formed by the first ion implantation, an upper part of the well region is inverted by the second ion implantation to form the source region. The doped region and well region can be formed by self-alignment in a common ion implantation step, improving power device performance, reducing numbers of process steps of ion implantation and masks, reducing manufacturing cost.

9 Claims, 7 Drawing Sheets

- prior art -

MANUFACTURING METHOD OF TRENCH-TYPE POWER DEVICE

CROSS-REFERENCE TO RELATED APPLICATIONS

The present application claims priority to Chinese Patent Application No. 202111648832.0, filed on Dec. 30, 2021, entitled by "MANUFACTURING METHOD OF TRENCH-TYPE POWER DEVICE", and published as CN114429906A on May 3, 2022, which is incorporated herein by reference in its entirety.

FIELD OF TECHNOLOGY

The present disclosure relates to a technical field of semiconductor devices, and more particularly, to a manufacturing method of a trench-type power device.

BACKGROUND

A power semiconductor device, also known as a power electronic device, comprises a power diode, a power transistor, a thyristor, etc. The power transistor comprises, for example, a VDMOS (vertical double-diffused metal oxide semiconductor) field effect transistor, a LDMOS (lateral diffused metal oxide semiconductor) field effect transistor and an IGBT (insulated gate bipolar transistor). On the basis of the VDMOS field effect transistor, a trench-type MOSFET is further proposed, wherein a gate conductor and a gate dielectric are formed in a trench, and in a conducting state, current mainly flows along a sidewall of the trench.

In a circuit application scenario, a diode is connected in parallel between a source and a drain of the power transistor to improve reverse recovery capability of the power transistor. FIG. 1 shows a schematic circuit diagram of a driving circuit for a three-phase brushless DC motor. The driving circuit comprises power transistors S11 to S13 and S21 to S23, diodes D11 to D13 and D21 to D23, and input capacitors. The power transistors S11 to S13 and S21 to S23 are connected to form a full-bridge inverter circuit, and each of the diodes D11 to D13 and D21 to D23 is reversely connected in parallel with a corresponding one of the power transistors. For example, an anode and a cathode of the diode D11 are connected to a source and a drain of the power transistor S11, respectively. When the power transistor is turned off, the corresponding diode provides a feedback path from load current to a power supply, so that a reverse bias voltage of the power transistor can be reduced and the reverse recovery capability can be improved.

It is desired to further improve a manufacturing process of the trench-type MOSFET, so as to integrate a reverse diode to improve the reverse recovery capability, and meanwhile simplify process steps.

SUMMARY

In view of the above problems, an objective of the present disclosure is to provide a manufacturing method of a trench-type power device, wherein a double-trench structure is used, and a doped region and a well region of P type are formed in a common ion implantation step by self-alignment, thereby reducing manufacturing cost of the power device.

According to an aspect of the present disclosure, a manufacturing method of a trench-type power device is provided, and comprises: forming a drift region on a semiconductor substrate; forming a first trench and a second trench in the drift region; forming a gate stack in the first trench; forming a doped region and a well region of P type in the drift region by performing first ion implantation; and forming a source region of N type in the well region by performing second ion implantation, wherein the well region in which a dopant concentration gradually decreases with depth is formed by the first ion implantation, and an upper part of the well region is inverted by the second ion implantation to form the source region.

In some embodiments, in the first ion implantation, by using the gate stack as a hard mask, the well region is formed between the first trench and the second trench, and the doped region is formed below a bottom of the second trench.

In some embodiments, in the second ion implantation, by using the gate stack as a hard mask and shielding the second trench with a resist mask, a dopant is implanted in the upper part of the well region.

In some embodiments, a dopant type of the semiconductor substrate and the drift region is N-type, and the semiconductor substrate serves as a drain region of a power transistor.

In some embodiments, the manufacturing method further comprises forming Schottky metal on a sidewall of the second trench, wherein the Schottky metal and the drift region form a Schottky barrier diode.

In some embodiments, the step of forming the Schottky metal comprises: forming a conformal first metal layer in the second trench; removing a portion, which is located at an upper part of the sidewall of the second trench, of the first metal layer, and a portion, which is located at a bottom of the second trench, of the first metal layer, by performing anisotropic etching, wherein a portion, which remains at a lower part of the sidewall of the second trench, of the first metal layer forms the Schottky metal.

In some embodiments, in the step of forming the Schottky metal, a top end of the Schottky metal is located between the source region and the drift region by controlling etching time of the anisotropic etching.

In some embodiments, after the step of forming the Schottky metal, the manufacturing method further comprises: forming a conformal second metal layer in the second trench; generating silicide by reaction of a portion of the second metal layer, by performing a silicidation process; and removing unreacted metal of the second metal layer relative to the Schottky metal and the silicide, by performing a selective etching process, wherein a portion, which is located at the upper part of the sidewall of the second trench, of the silicide forms a first contact layer, and a portion, which is located at the bottom of the sidewall of the second trench, of the silicide forms a second contact layer.

In some embodiments, after the step of forming the Schottky metal, the manufacturing method further comprises: filling a conductive material in the second trench to form a conductive channel for providing an electrical connection path between the source region and the Schottky metal.

According to the manufacturing method of the trench-type power device of embodiments of the present disclosure, the doped region and the well region of P type are formed in the common ion implantation step by self-alignment. The gate conductor is located in the first trench and at least partially adjacent to a body region, so that an electric field is applied to a channel in the body region. The channel of the trench-type MOSFET is adjacent to the sidewall of the first trench and vertically extends to form a vertical channel, so that the trench-type MOSFET has a smaller unit area, a lower specific on-resistance Rsp, and an improved voltage endurance capability. A heavily doped region of P type is formed below the bottom of the second trench. The doped region of P type is beneficial to alleviating electric field concentration under the first trench, thereby improving the reliability of electric field control of the gate stack. By means of the manufacturing method, the yield and performance of the power device can be increased and improved by the self-alignment process, three doped regions can be formed by using a single resist mask and two times of ion implantations, thus reducing the number of the process steps of ion implantation and the number of masks, and reducing the manufacturing cost of the power device.

In some embodiments, Schottky metal is formed on the sidewall of the second trench, so that a Schottky diode can be integrated with the minimum unit area cost to improve the reverse recovery capability of the power device.

BRIEF DESCRIPTION OF THE DRAWINGS

The above and other objectives, features and advantages of the present disclosure will become more apparent from the description of the embodiments of the present disclosure below with reference to the accompanying drawings, in which.

DESCRIPTION OF THE EMBODIMENTS

Figure 1:
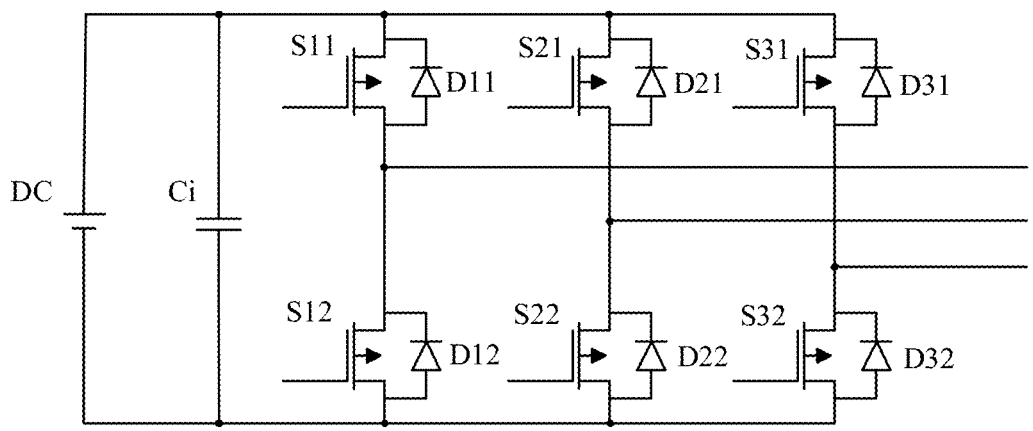
FIG. 1 shows a schematic circuit diagram of a driving circuit for a three-phase brushless DC motor.

The present disclosure will be described in more detail below with reference to the accompanying drawings. In the various figures, the same elements are denoted by the similar reference numerals. For the sake of clarity, the various parts in the figures are not drawn to scale. Additionally, some well-known parts may not be shown. For the sake of simplicity, a semiconductor structure obtained after several steps can be described in one figure.

It will be understood that in the description of device structures, when a layer or region is referred to as being "on" or "above" another layer or region, it can be directly on the other layer or region or there may be other layers or regions therebetween. And, if the device is turned over, this layer and region will be "below" or "under" another layer and region.

In order to describe a situation where a layer or region is directly on another layer or region, the expression "directly on . . . " or "on and adjacent to . . . " will be used herein.

The specific implementation of the present disclosure will be further described in detail in combination with drawings and the embodiment.

Figure 2:
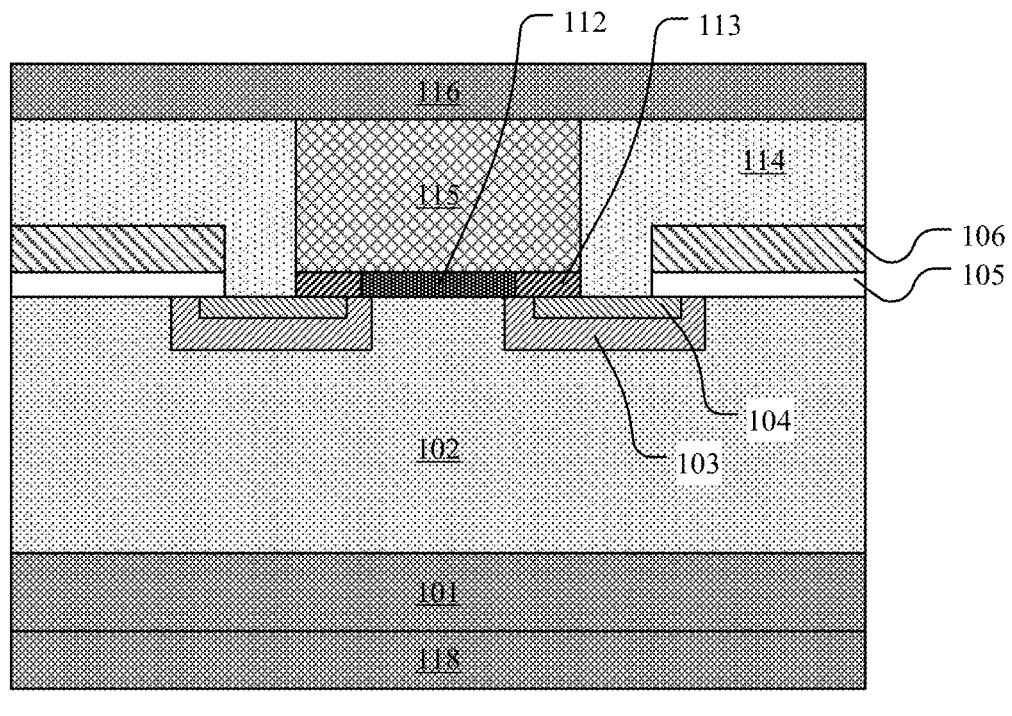
FIG. 2 shows a schematic cross-sectional view of a power device according to the prior art.

FIG. 2 shows a schematic cross-sectional view of a power device according to the prior art. A power transistor and a diode are integrated in the power device, wherein the diode may be a Schottky Barrier diode (SBD).

The power device 100 comprises a semiconductor substrate 101, a drift region 102 located on the semiconductor substrate 101, a well region 103 located in the drift region 102, and a source region 104 located in the well region 103. The semiconductor substrate 101 also serves as a drain region of a MOSFET. A dopant type of the semiconductor substrate 101, the drift region 102 and the source region 104 is, for example, N-type, and the dopant type of the well region is, for example, P-type. The semiconductor substrate 101 is, for example, a heavily doped N-type silicon carbide substrate, and the drift region 102 is, for example, a lightly doped N-type epitaxial layer epitaxially grown on a surface of the semiconductor substrate 101. The well region 103 and the source region 104 are doped regions formed, for example, by performing ion implantation.

An opening is formed in the well region 103, which exposes a surface of the drift region 102. For example, the well region 103 is split into two portions and the opening is formed between the two portions of the well region 103, or the well region 103 is in an integral shape and forms the opening surrounded by a closed portion. Anode metal 112 of the Schottky barrier diode is located on the opening, so as to be in contact with the surface of the drift region 102 via the opening. Performance requirements of the Schottky barrier diode can be met based on a contact area provided by the opening. A contact layer 113 is located on a surface of the source region 104 of the MOSFET and extends laterally to be in contact with the anode metal 112 of the Schottky barrier diode, thereby connecting a source of the MOSFET with an anode of the Schottky barrier diode.

The gate stack comprises a gate dielectric 105 and a gate conductor 106 that are stacked. For example, the gate stack extends laterally from an edge of the source region 103 to the edge of a body region 104, and accordingly at least a portion of the gate conductor 106 is located above the body region 103 and is separated from the body region 103 by the gate dielectric 105, so that an electric field can be applied to a channel in the body region 103.

An interlayer dielectric layer 114 covers the source region and the gate stack of the power device, and is formed with a contact hole exposing Schottky anode metal. A conductive material is filled in the contact hole to form a conductive channel 115. Further, a source electrode 116 electrically connected to the conductive channel 115 is formed on the interlayer dielectric layer 114, and a drain electrode 118 is formed on a surface, opposite to the source region, of the semiconductor substrate 101.

The power device according to the above-mentioned prior art comprises a source electrode and a drain electrode formed on the opposite surfaces of the substrate, however, a planar gate structure is still used in the power device.

The inventors have noticed that compared with the power device with the planar gate structure, the trench-type MOSFET with a trench gate structure can have smaller unit area, lower specific on-resistance Rsp, and improved voltage withstand capability. Therefore, the inventors further develop a trench-type MOSFET with an integrated Schottky barrier diode.

Figure 3:
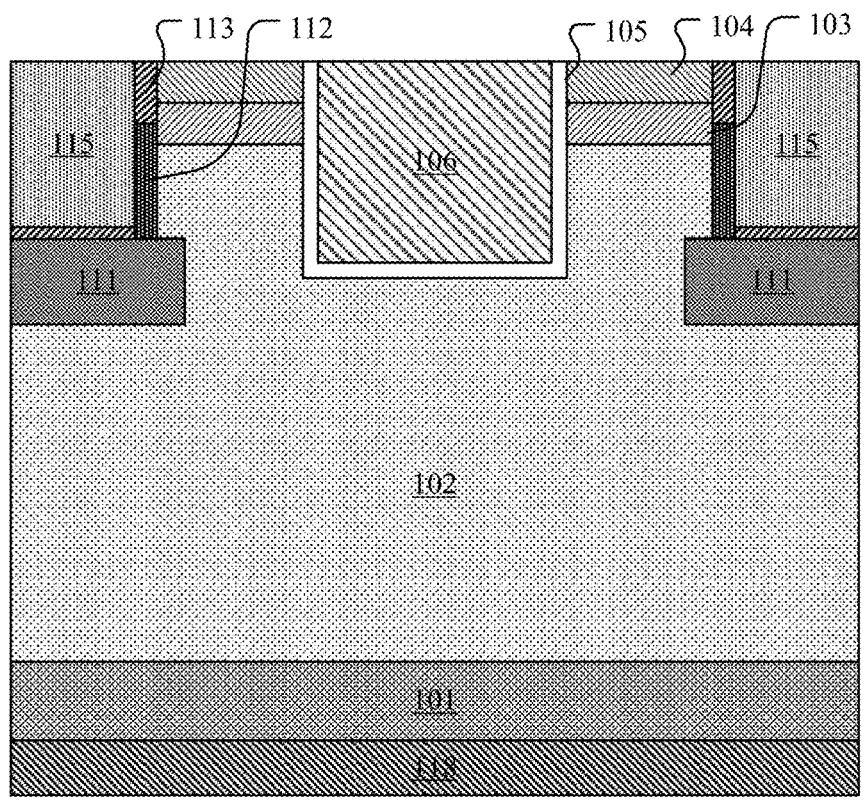
FIG. 3 shows a schematic cross-sectional view of a trench-type power device according to a first embodiment of the present disclosure.

FIG. 3 shows a schematic cross-sectional view of a trench-type power device according to a first embodiment of the present disclosure. A power transistor and a diode are integrated in the trench-type power device, wherein the diode can be implemented by a Schottky Barrier diode (SBD).

The power device 200 comprises a semiconductor substrate 101, a drift region 102 located on the semiconductor substrate 101, a well region 103 located in the drift region 102, and a source region 104 located in the well region 103. The semiconductor substrate 101 also serves as a drain region of a MOSFET. A dopant type of the semiconductor substrate 101, the drift region 102 and the source region 104 is, for example, N-type, and the dopant type of the well region is, for example, P-type. The semiconductor substrate 101 is, for example, a heavily doped N-type silicon carbide substrate, and the drift region 102 is, for example, a lightly doped N-type epitaxial layer epitaxially grown on a surface of the semiconductor substrate 101. The well region 103 and the source region 104 are doped regions formed by performing ion implantation, for example.

The first trench and the second trench extend from the surface of the source region 104 into the drift region 102, respectively, and sequentially penetrate through the source region 104 and the well region 103.

A gate dielectric 105 is formed on a sidewall and a bottom of the first trench, and a gate conductor 106 is filled inside the first trench. At least a portion of the gate conductor 106 is adjacent to the body region 103 and is separated from the body region 103 by the gate dielectric 105, so that an electric field can be applied to a channel in the body region 103.

Schottky metal 112 and a contact layer 113 are formed on a sidewall of the second trench, and a conductive channel 115 is filled inside the second trench. The contact layer 113 is located at an upper part of the sidewall of the second trench and is in contact with an end of the source region 104. The Schottky metal 112 is located at a lower part of the sidewall of the second trench and is in contact with the drift region 102. In some embodiments, a top end of the Schottky metal 112 is located between the source region 104 and the drift region 102, that is, located in the well region 103. The contact layer 113 extends along the sidewall of the second trench, thereby connecting a source electrode of the MOSFET with the anode of the Schottky barrier diode. Performance requirements of the Schottky barrier diode can be met based on the contact area provided by the sidewall of the second trench.

Further, a drain electrode 118 is formed on a surface, opposite to the source region, of the semiconductor substrate 101. Although not shown, the trench-type MOSFET 200 may further comprise an interlayer dielectric layer and the source electrode located on the interlayer dielectric layer, and the source electrode is connected to the conductive channel 115 via a conductive channel in the interlayer dielectric layer, so that electrical connection between the source region 104 of the MOSFET and the anode metal 112 of the Schottky barrier diode can be realized.

The trench-type power device according to embodiments of the present disclosure may not only comprise the source electrode and the drain electrode formed on the opposite surfaces of the substrate, but also use a double-trench structure in which the gate conductor is located in the first trench and at least partially adjacent to the body region, so that an electric field can be applied to the channel in the body region. The channel of the trench-type MOSFET is adjacent to the sidewall of the first trench and vertically extends to form a vertical channel, so that the trench-type MOSFET has a smaller unit area, a lower specific on-resistance Rsp, and an improved voltage withstand capability.

Further, a heavily doped region 121 of P type is formed below the bottom of the second trench, and a contact layer 122 is formed at the bottom of the second trench. The conductive channel 115 filled in the second trench is connected to the doped region 121 via the contact layer 122, connected to the source region 103 via the contact layer 113, and directly connected to the anode metal 112 respectively. The doped region 121 is beneficial to alleviating electric field concentration under the first trench, thereby improving reliability of electric field control of the gate stack.

In some embodiments, Schottky metal is formed on the sidewall of the second trench, so that a Schottky diode can be integrated with minimum unit area cost, so as to improve the reverse recovery capability of the power device.

The inventors have noticed that although forming the doped region 121 of P type and the integrated Schottky diode in the trench-type power device is beneficial to improving device performance, an additional resist mask and ion implantation process are required for forming the doped region 121 of P type, thus increasing the manufacturing cost of the power device. Therefore, the inventors further provide a manufacturing method of a trench-type MOSFET to simplify process steps.

FIGS. 4a to 4h show schematic cross-sectional views at various stages of a manufacturing method of a trench-type power device according to a second embodiment of the present disclosure.

The manufacturing method starts with the semiconductor substrate 101. The semiconductor substrate 101 used in the power transistor is, for example, a silicon substrate, a silicon carbide substrate, a gallium nitride substrate or the like. In an embodiment of the present disclosure, it is preferable to use a heavily doped N-type silicon carbide substrate since wide bandgap characteristic of silicon carbide is conducive to reducing leakage current and power consumption, and high breakdown field strength is conducive to improving the voltage withstand capability, increasing current density, and reducing device size. Furthermore, the heavily doped N-type silicon carbide substrate can also serve as a drain region of the power device.

Figure 4A:
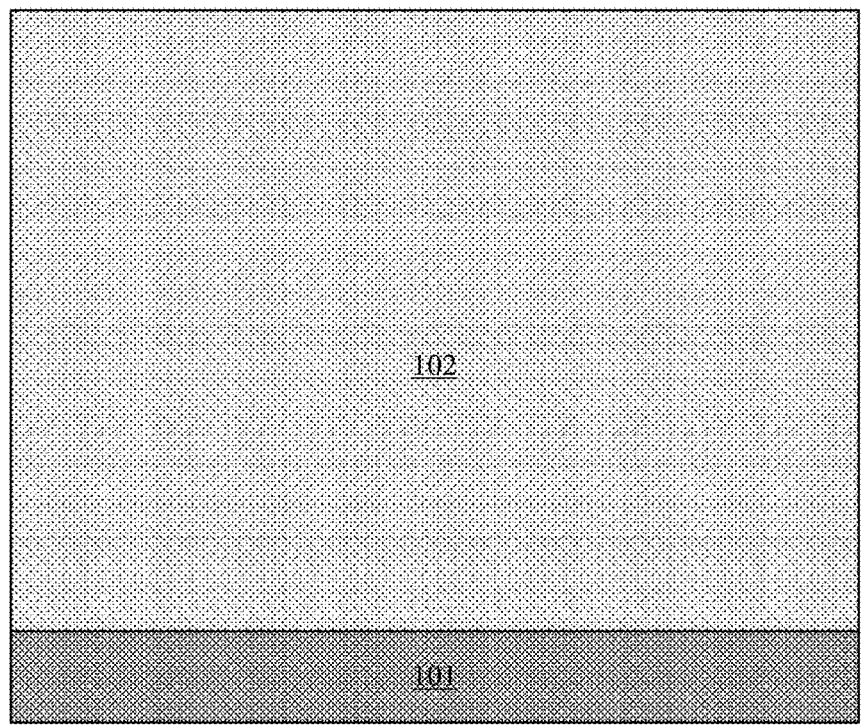
FIGS. 4a to 4h show schematic cross-sectional views at various stages of a manufacturing method of a trench-type power device according to a second embodiment of the present disclosure.

Referring to FIG. 4a, the drift region 102 is formed on the semiconductor substrate 101.

In this step, an epitaxial layer is grown on the surface of the semiconductor substrate 101 by performing an epitaxial growth process, and the epitaxial layer is doped by performing in-situ doping during the epitaxial growth process, so as to form a lightly doped N-type epitaxial layer. In an embodiment, a silicon carbide epitaxial layer can be formed on a silicon carbide substrate by performing chemical vapor deposition, thereby forming the lightly doped N-type drift region 102 made of silicon carbide.

Figure 4B:
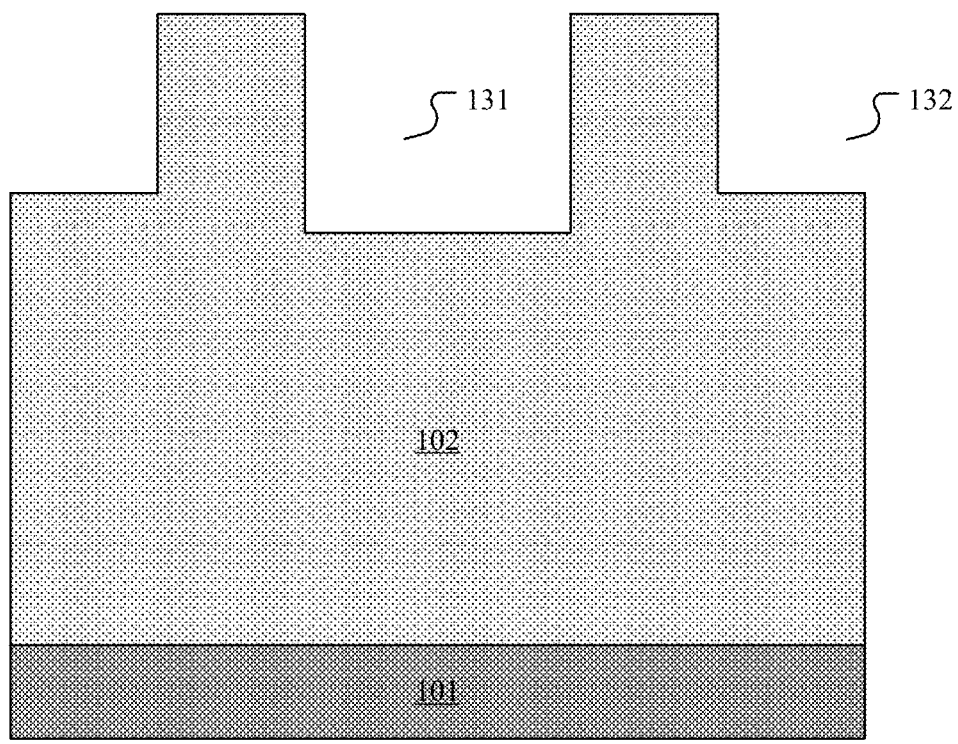

Referring to FIG. 4b, the first trench 131 and the second trench 132 extending from the surface of the source region 104 into the drift region 102 are formed.

In this step, a resist mask is formed on the surface of the source region 104, and a pattern is formed in the resist mask by performing a photolithographic process. The drift region 102 is etched through an opening in the pattern, by performing anisotropic dry etching, so that the first trench 131 and the second trench 132 are formed. By controlling etching time, the first trench 131 and the second trench 132 can be controlled to reach a predetermined depth in the drift region 102.

After the etching process, the resist mask can be removed by solvent dissolution or ashing.

Figure 4C:
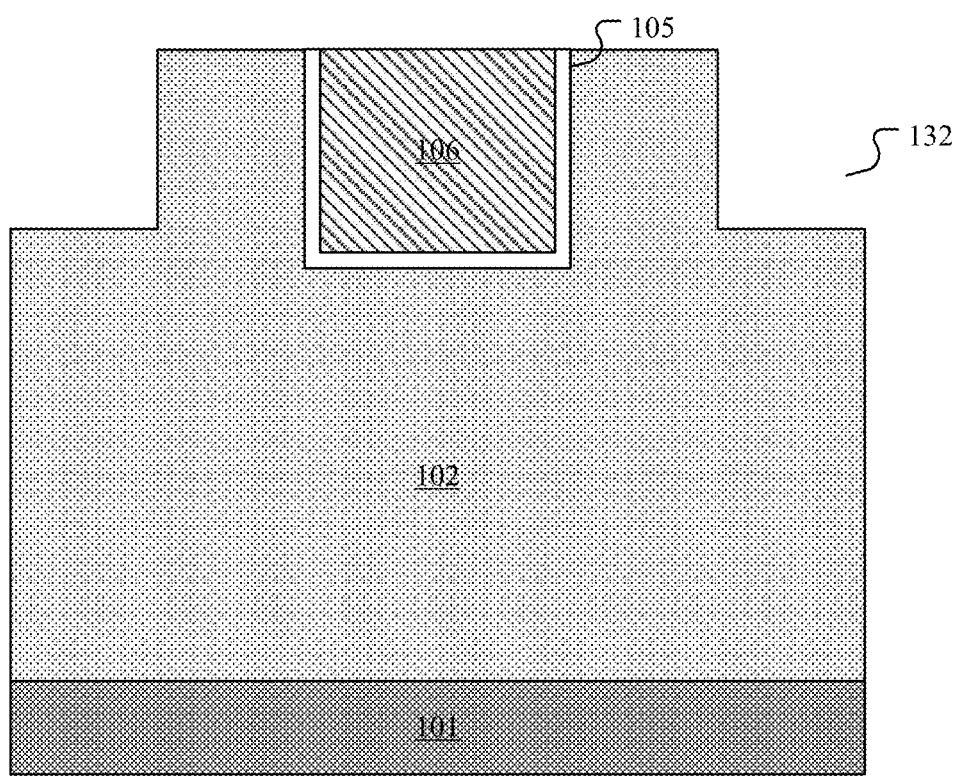

Referring to FIG. 4c, the gate dielectric 105 is formed on a sidewall and a bottom of the first trench 131, and the gate conductor 106 is filled inside the first trench.

In this step, for example, silicon carbide is converted into silicon oxide by performing thermal oxidation, so as to form the gate dielectric 105. Then, a conductive material is deposited to fill the first trench 131, and the conductive material outside the first trench 131 can be removed by performing chemical mechanical planarization, so that the gate conductor 106 is formed.

Figure 4D:
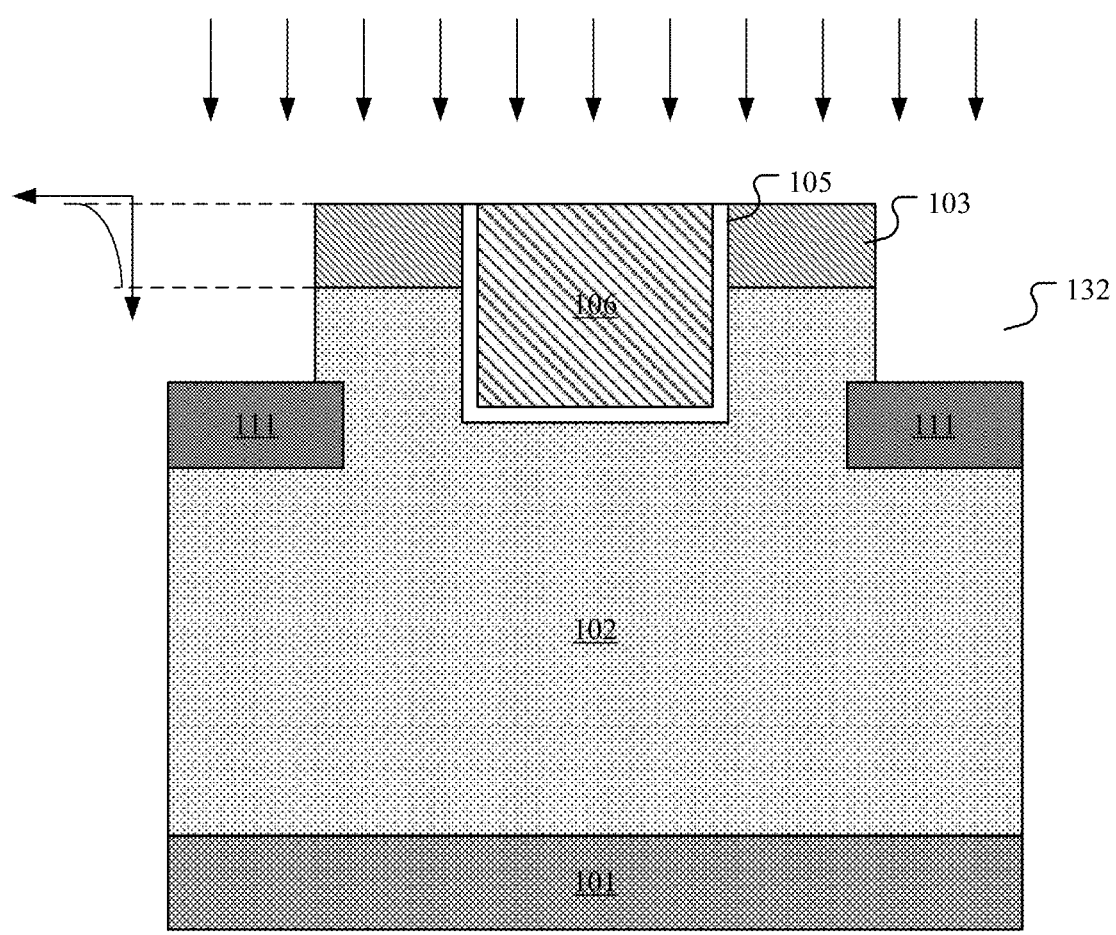

Referring to FIG. 4d, the doped region 111 and the well region 103 of P type are formed in the drift region 102 by performing the first ion implantation.

In this step, by using the gate stack as a hard mask, a P-type dopant is implanted in a portion, which is located between the first trench 131 and the second trench 132, of the drift region 102 to form the well region 103, and a P-type dopant is implanted in a portion, which is located below the bottom of the second trench 132, of the drift region 102 to form the doped region 111.

In the first ion implantation, a dopant used to form the doped region of P type is, for example, Al and/or B. By controlling process parameters of the ion implantation, for example, ion energy and implantation dosage, dopant distribution with dopant concentration that gradually decreases with depth can be implemented.

Figure 4E:
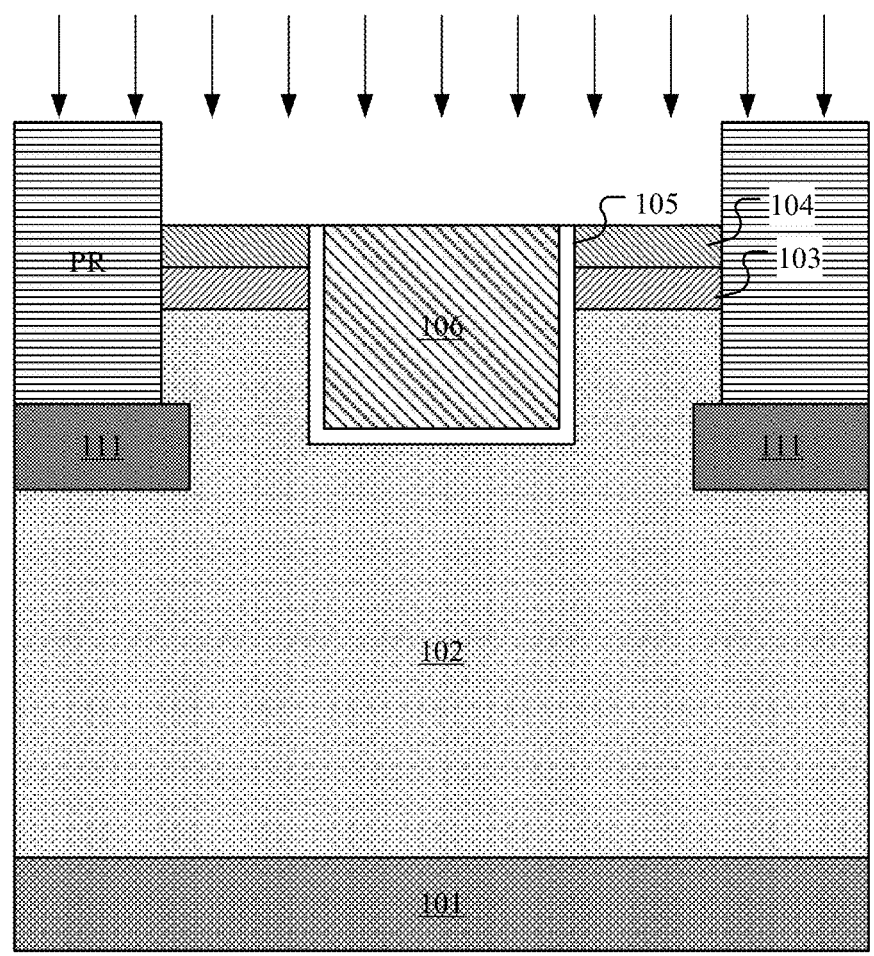

Referring to FIG. 4e, the source region 104 of N type is formed in the well region 103 by performing the second ion implantation.

In this step, a resist mask PR is formed by performing the above-mentioned photolithographic process, to shield the second trench 132. By using the gate stack as a hard mask and using the resist mask PR, N-type dopant can be implanted into the well region 103 to form the source region 104.

In the second ion implantation, dopant used to form the doped region of N type is, for example, P and/or As. By controlling the process parameters of the ion implantation, such as the ion energy and implantation dosage, implantation depth and dopant concentration can be controlled, so that the N-type dopant is located at the upper part of the well region 103, and the concentration of the N-type dopant can be higher than that of the P-type dopant, thereby inverting the dopant type of the upper part of the well region 103 to form the source region 104.

Further, since the well region 103 formed in the first ion implantation process has a dopant distribution with dopant concentration that gradually decreases with depth, a remaining portion of the well region 103 is a lightly doped well region of P type after the second ion implantation process is performed. By performing the first ion implantation and the second ion implantation, three doped regions (i.e., the well region 103, the source region 104 and the doped region 111) can be formed by using a single resist mask and two times of ion implantation, so that the number of the process steps of ion implantation and the number of masks can be reduced.

After the second ion implantation process, the resist mask PR can be removed by solvent dissolution or ashing.

Figure 4F:
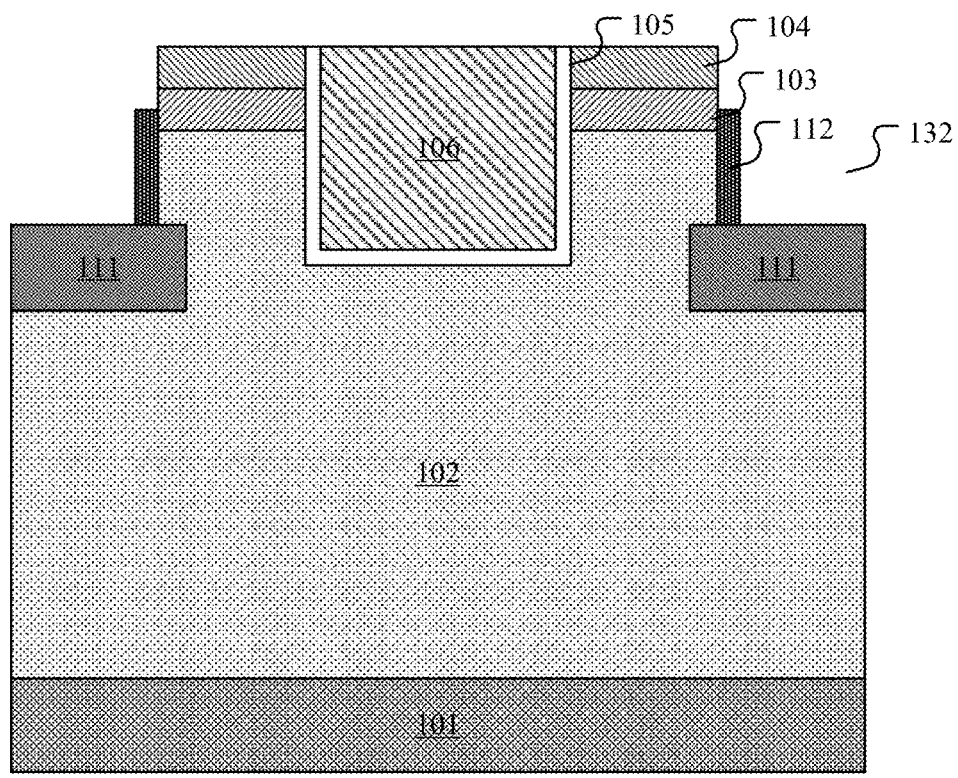

Referring to FIG. 4f, Schottky metal 112 is formed at the lower part of the sidewall of the second trench 132.

In this step, a conformal metal layer is formed in the second trench 132 by performing chemical vapor deposition. Further, a portion, which is located on an upper part of the sidewall of the second trench 132, of the metal layer, and a portion, which is located on a bottom surface of the second trench 132, of the metal layer are removed by performing anisotropic etching process, so that the metal layer only remains on the lower part of the sidewall of the second trench 132 to form the Schottky metal 112. By controlling the etching time, a top end position of the Schottky metal 112 can be controlled. In an embodiment, the top end of the Schottky metal 112 is located between the source region 104 and the drift region 102. The metal layer used for the Schottky metal 112 is, for example, made of titanium.

Figure 4G:
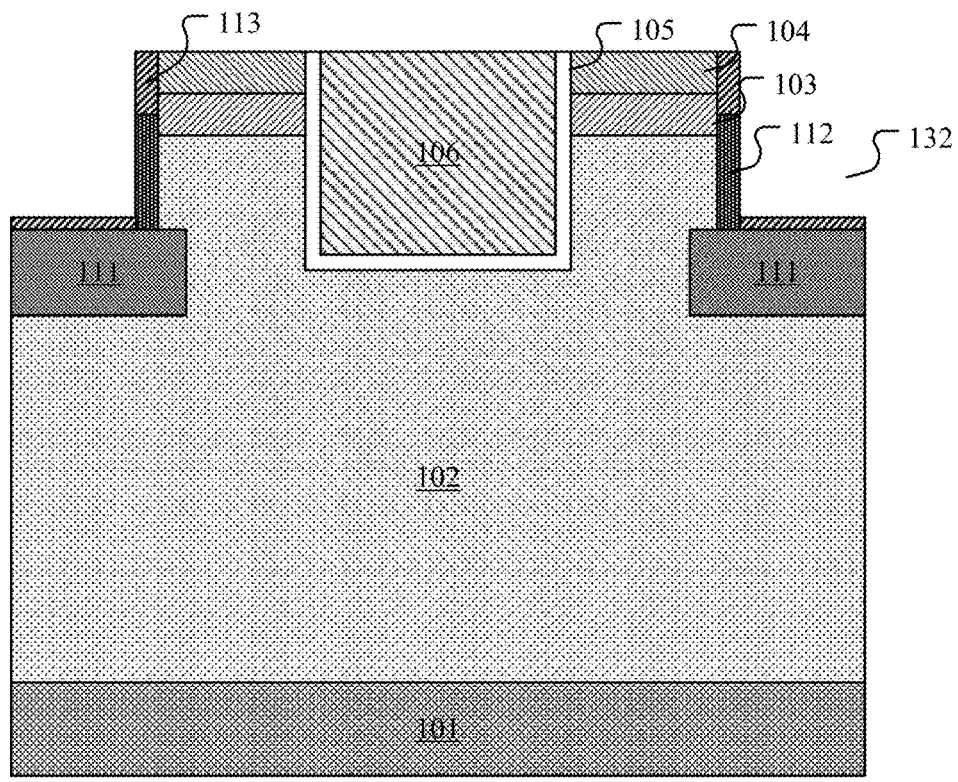

Referring to FIG. 4g, a contact layer 113 is formed at the upper part of the sidewall of the second trench 132, and a contact layer 122 is formed at the bottom of the second trench 132.

In this step, a conformal metal layer is formed on the sidewall and the bottom of the second trench 132 by performing chemical vapor deposition or sputtering. At the upper part of the sidewall of the second trench 132, the metal layer covers exposed surfaces of the source region 104 and the well region 103, and at the bottom of the second trench 132, the metal layer covers an exposed surface of the drift region 102. Further, by performing a silicidation process, for example, heat treatment, the metal layer reacts with silicon in the source region 104, the well region 103 and the drift region 102 to form silicide. Further, unreacted metal material can be selectively removed relative to the Schottky metal and the silicide by performing selective wet etching, so that the silicide which remains at the upper part of the sidewall of the second trench 132 forms the contact layer 113, and the silicide which remains at the bottom of the second trench 132 forms the contact layer 122. For example, the Schottky metal is made of titanium, the contact layers 113 and 122 are made of nickel silicide, and the metal layers used to form the contact layers 113 and 122 are made of nickel. Therefore, selective removal can be performed based on etching rates of different materials in the etching process.

Figure 4H:
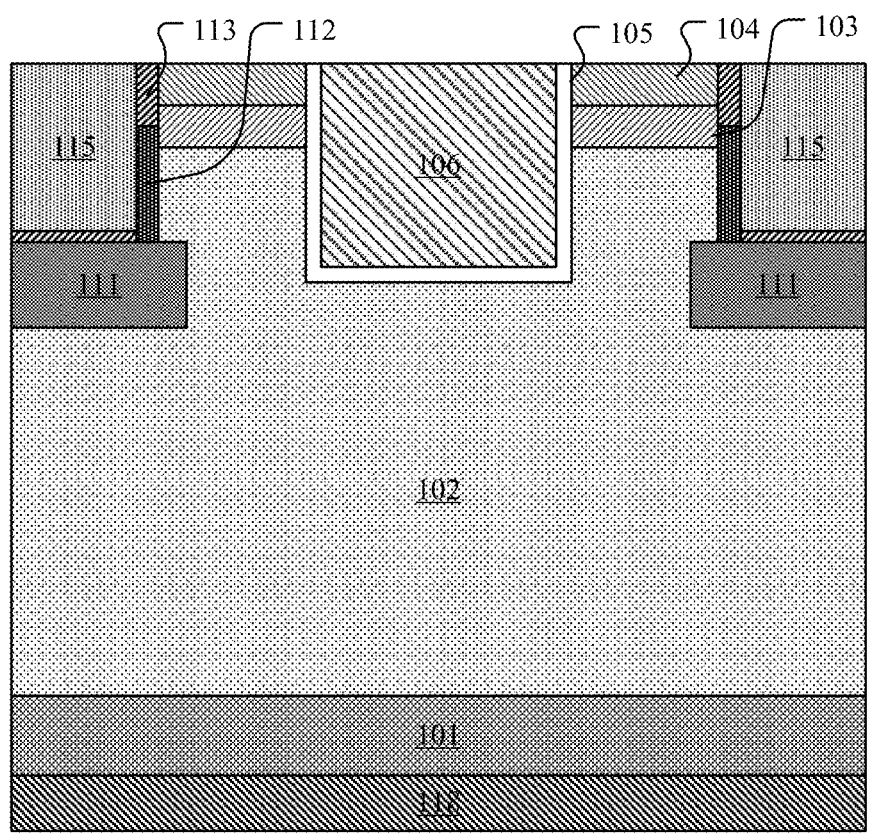

Referring to FIG. 4h, conductive material is filled inside the second trench 132 to form the conductive channel 115.

The conductive channel 115 filled in the second trench is connected to the doped region 121 via the contact layer 122, connected to the source region 103 via the contact layer 113, and directly connected to the anode metal 112, respectively. The conductive channel 115 is made of, for example, aluminum, copper, or an alloy thereof.

Further, a drain electrode 118 is formed on the surface, opposite to the source region, of the semiconductor substrate 101. Although not shown, the trench-type MOSFET may further comprise an interlayer dielectric layer and a source electrode located on the interlayer dielectric layer, and the source electrode is connected to the conductive channel 115 via a conductive channel in the interlayer dielectric layer, so that electrical connection between the source region 104 of the MOSFET and the anode metal 112 of the Schottky barrier diode is realized.

The embodiments in accordance with the present disclosure, as described above, are not described in detail, and are not intended to limit the present invention to be only the described particular embodiments. Obviously, many modifications and variations are possible in light of the above. These embodiments have been chosen and described in detail by the specification to explain the principles and embodiments of the present invention so that those skilled in the art can make good use of the present invention and the modified use based on the present disclosure. The invention is to be limited only by the scope of the appended claims and the appended claims and equivalents thereof.

What is claimed is:

1. A manufacturing method of a trench-type power device, wherein the manufacturing method comprises:
   forming a drift region on a semiconductor substrate;
   forming a first trench and a second trench in the drift region;
   forming a gate stack in the first trench;
   forming a doped region and a well region of P type in the drift region by performing first ion implantation; and
   forming a source region of N type in the well region by performing second ion implantation, wherein the well region in which a dopant concentration gradually decreases with depth is formed by the first ion implantation, and an upper part of the well region is inverted by the second ion implantation to form the source region, wherein in the first ion implantation, by using the gate stack as a hard mask, the well region is formed between the first trench and the second trench, and the doped region is formed below a bottom of the second trench, and the doped region extends to a first depth in the drift region, the well region extends to a second depth in the drift region, and the first depth is greater than the second depth.

2. The manufacturing method according to claim 1, wherein in the second ion implantation, by using the gate stack as a hard mask and shielding the second trench with a resist mask, a dopant is implanted in the upper part of the well region.

3. The manufacturing method according to claim 1, wherein a dopant type of the semiconductor substrate and the drift region is N-type, and the semiconductor substrate serves as a drain region of a power transistor.

4. The manufacturing method according to claim 1, further comprising:

forming Schottky metal on a sidewall of the second trench, wherein the Schottky metal and the drift region form a Schottky barrier diode.

5. The manufacturing method according to claim 4, wherein the step of forming the Schottky metal comprises:

forming a conformal first metal layer in the second trench; and removing a portion, which is located at an upper part of the sidewall of the second trench, of the first metal layer, and a portion, which is located at a bottom of the second trench, of the first metal layer, by performing anisotropic etching, wherein a portion, which remains at a lower part of the sidewall of the second trench, of the first metal layer forms the Schottky metal.

6. The manufacturing method according to claim 5, wherein in the step of forming the Schottky metal, a top end of the Schottky metal is located between the source region and the drift region by controlling etching time of the anisotropic etching.

7. The manufacturing method according to claim 6, wherein after the step of forming the Schottky metal, the manufacturing method further comprises:

forming a conformal second metal layer in the second trench;

generating silicide by reaction of a portion of the second metal layer, by performing a silicidation process; and removing unreacted metal of the second metal layer relative to the Schottky metal and the silicide, by performing a selective etching process, wherein a portion, which is located at the upper part of the sidewall of the second trench, of the silicide, forms a first contact layer, and a portion, which is located at the bottom of the sidewall of the second trench, of the silicide forms a second contact layer.

8. The manufacturing method according to claim 6, wherein after the step of forming the Schottky metal, the manufacturing method further comprises:

filling a conductive material in the second trench to form a conductive channel for providing an electrical connection path between the source region and the Schottky metal.

9. The manufacturing method according to claim 1, wherein the doped region is separate from the well region in position, and is formed simultaneously with the well region by the first implantation after the second trench is formed.

* * * * *